(12) United States Patent  
Park (10) Patent No.: US 12,482,783 B2
(45) Date of Patent: Nov. 25, 2025

(54) SEMICONDUCTOR PACKAGE INCLUDING BONDING WIRE COATED WITH OXIDE INSULATION, ELECTRONIC SYSTEM INCLUDING SAME, AND BATTERY MODULE INCLUDING SAME

(71) Applicant: Soo Jae Park, Seoul (KR)

(72) Inventor: Soo Jae Park, Seoul (KR)

( * ) Notice: Subject to any disclaimer, the term of this patent is extended or adjusted under 35 U.S.C. 154(b) by 364 days.

(21) Appl. No.: 18/274,369

(22) PCT Filed: Jan. 7, 2022

(86) PCT No.: PCT/KR2022/000317
§ 371 (c)(1),
(2) Date: Jul. 26, 2023

(87) PCT Pub. No.: WO2022/164073
PCT Pub. Date: Aug. 4, 2022

(65) Prior Publication Data
US 2024/0088088 A1 Mar. 14, 2024

(30) Foreign Application Priority Data
Feb. 1, 2021 (KR) .................. 10-2021-0014291

(51) Int. Cl.
*H01L 23/00* (2006.01)
*H01L 21/02* (2006.01)
*H01L 25/065* (2023.01)

(52) U.S. Cl.
CPC ........ *H01L 24/45* (2013.01); *H01L 21/02186* (2013.01); *H01L 21/0228* (2013.01); *H01L 24/05* (2013.01); *H01L 25/0655* (2013.01); *H01L 2224/05023* (2013.01); *H01L 2224/05624* (2013.01); *H01L 2224/4502* (2013.01); *H01L 2224/45144* (2013.01);
(Continued)

(58) Field of Classification Search
None
See application file for complete search history.

(56) References Cited

U.S. PATENT DOCUMENTS

| 7,061,080 B2 | 6/2006 | Jeun |
| 2004/0217458 A1 | 11/2004 | Downey et al. |
| 2008/0124547 A1 | 5/2008 | O et al. |

(Continued)

FOREIGN PATENT DOCUMENTS

| JP | 06-021135 A | 1/1994 |
| JP | 2008-122328 A | 5/2008 |

(Continued)

*Primary Examiner* — Jack S Chen
(74) *Attorney, Agent, or Firm* — Bridgeway IP Law Group, PLLC; Sang Ho Lee; Hyun Woo Shin (57) ABSTRACT

Provided is a semiconductor package including a bonding wire coated with oxide insulation, an electronic system including same, and a battery module including same. The semiconductor package includes: a substrate; a semiconductor chip mounted on the substrate; a bonding wire connecting the substrate and the semiconductor chip and including a metal core portion located on the inside and an oxide insulation coating portion coating the metal core portion; and first fragments made of the same material as the oxide insulation coating portion of the bonding wire and located at a first portion at which the substrate and the bonding wire are connected.

12 Claims, 10 Drawing Sheets

(52) U.S. Cl.
CPC .............. *H01L 2224/45147* (2013.01); *H01L 2924/1431* (2013.01); *H01L 2924/1435* (2013.01)

(56) References Cited

U.S. PATENT DOCUMENTS

| | | |
|---|---|---|
| 2010/0212153 A1 | 8/2010 | Roth et al. |
| 2018/0082977 A1 | 3/2018 | Yagyu |
| 2024/0088088 A1* | 3/2024 | Park .................... H01L 25/0655 |

FOREIGN PATENT DOCUMENTS

| | | |
|---|---|---|
| JP | 2013-118310 A | 6/2013 |
| KR | 10-0817076 B1 | 3/2008 |
| KR | 10-0867573 B1 | 11/2018 |
| KR | 2020-0056715 A | 5/2020 |
| KR | 10-2323557 B1 | 11/2021 |

\* cited by examiner

SEMICONDUCTOR PACKAGE INCLUDING BONDING WIRE COATED WITH OXIDE INSULATION, ELECTRONIC SYSTEM INCLUDING SAME, AND BATTERY MODULE INCLUDING SAME

TECHNICAL FIELD

The technical ideas of the present disclosure relate to a semiconductor package, and more particularly to a semiconductor package including a bonding wire coated with oxide insulation, an electronic system including the same, and a battery module including the same.

BACKGROUND ART

In a semiconductor package, a bonding pad on a wiring substrate, such as a printed circuit board or lead frame, and a chip pad on a semiconductor chip are electrically connected by bonding wires composed of metal. This process is referred to as a wire bonding process. In the wire bonding process, as the chip pad of a semiconductor chip is miniaturized and an integrated package in which multiple layers of semiconductor chips are stacked is applied, an electrical short circuit occurs in which the metal wires stick together. Therefore, there is a need for a bonding wire to prevent this shorting phenomenon.

DISCLOSURE

Technical Problem

Therefore, the present disclosure has been made in view of the above problems, and it is one object of the present disclosure to provide a semiconductor package including a bonding wire coated with oxide insulation, an electronic system including the same, and a battery module including the same.

However, this object is exemplary, and the technical ideas of the present disclosure are not limited thereto.

Technical Solution

According to one aspect of the present disclosure, provided are a semiconductor package including a bonding wire coated with oxide insulation, an electronic system including the same, and a battery module including the same.

According to one embodiment of the present disclosure, the semiconductor package may include: a substrate; a semiconductor chip mounted on the substrate; a bonding wire electrically connecting the substrate and the semiconductor chip, the bonding wire including a metal core disposed therein; and an oxide insulation coating covering the metal core; and first fragments located in a first portion where the substrate and the bonding wire are connected, the first fragments being formed of the same material as the oxide insulation coating of the bonding wire.

According to one embodiment of the present disclosure, the first fragments may include fragments of the oxide insulation coating fragmented while the bonding wire is bonded, According to one embodiment of the present disclosure, the semiconductor package may further include an intermetallic compound layer formed within the first portion where the substrate and the bonding wire are connected, wherein at least a portion of the first fragments may be located within the intermetallic compound layer.

According to one embodiment of the present disclosure, the semiconductor package may further include second fragments located in a second portion where the semiconductor chip and the bonding wire are connected, the second fragments being formed of the same material as the oxide insulation coating of the bonding wire.

According to one embodiment of the present disclosure, the second fragments may include fragments of the oxide insulation coating fragmented while the bonding wire is bonded.

According to one embodiment of the present disclosure, the oxide insulation coating may contain at least one of aluminum oxide, titanium oxide, zirconium oxide, or hafnium oxide, and the metal core may contain gold, silver, copper, aluminum, palladium, and alloys thereof.

According to one embodiment of the present disclosure, the oxide insulation coating may have a thickness of 2 nm to 50 nm.

According to one embodiment of the present disclosure, the metal core may consist of a single wire, include a plurality of coaxial wires, or include a plurality of wires twisted together.

According to one embodiment of the present disclosure, the semiconductor package may include a substrate; first and second semiconductor chips mounted on the substrate; a first bonding wire electrically connecting the first semiconductor chip and the second semiconductor chip, the first bonding wire may include a metal core disposed therein; and an oxide insulation coating covering the metal core; and third fragments located in a portion where the first semiconductor chip and the first bonding wire are connected, the third fragments being formed of the same material as the oxide insulation coating of the bonding wire.

The semiconductor package may further include fourth fragments located in a portion where the second semiconductor chip and the first bonding wire are connected, the fourth fragments being formed of the same material as the oxide insulation coating of the first bonding wire; a second bonding wire electrically connecting one of the first semiconductor chip and the second semiconductor chip to the substrate; and fifth fragments located in a portion where the substrate and the second bonding wire are connected, the fifth fragments being formed of the same material as the oxide insulation coating of the second bonding wire.

According to one embodiment of the present disclosure, the battery module may include: a first battery; a second battery electrically connected to the first battery; a bonding wire electrically connecting the first battery and the second battery, the bonding wire including a metal core disposed therein; an oxide insulation coating covering the metal core; and fragments located in a portion where the bonding wire is connected to the first battery or the second battery, the fragments being formed of the same material as the oxide insulation coating of the bonding wire.

Advantageous Effects

In accordance with the technical ideas of the present disclosure, in a semiconductor package, by electrically connecting a substrate and a semiconductor chip, or a semiconductor chip and another semiconductor chip using bonding wires coated with oxide insulation, shorting may be prevented between the bonding wires, and the bonding wires may be integrated at a high density. In addition, a long bonding wire may be used between chips. Furthermore, as the bonding wire is coated with oxide insulation, shorting may be prevented, and the diameter of the bonding wire may be reduced. When the oxide insulation coating of the bonding wire is composed of at least one of aluminum oxide, titanium oxide, zirconium oxide, and hafnium oxide, the bonding wire has an excellent insulation property and an excellent dielectric strength, and is highly stable because it does not form an intermetallic compound with the material constituting the metal core. It provides an excellent bonding property of the bonding wire and an excellent protectiveness.

As first fragment or second fragment formed from the oxide insulation coating of the bonding wire is composed of a metal oxide such as at least one of aluminum oxide, titanium oxide, zirconium oxide, and hafnium oxide, the roughness of the bonding surface of the substrate or semiconductor chip may be increased, thereby improving the adhesion with the bonding wire. In particular, adhesion may be further increased in the case of stitch bonding because the intermetallic bonding with at least one of aluminum oxide, titanium oxide, zirconium oxide, and hafnium oxide is stronger than bonding by intermetallic compounds.

The effects of the present disclosure described above are exemplary and are not intended to limit the scope of the present disclosure.

BEST MODE

Hereinafter, preferred embodiments of the present disclosure will be described in detail with reference to the accompanying drawings. The embodiments of the present disclosure are provided to provide a more complete description of the technical ideas of the present disclosure to one of ordinary skill in the art, and various other modifications may be made to the embodiments. The scope of the technical ideas of the present disclosure is not limited to the embodiments. Rather, these embodiments are provided to make the disclosure more faithful and complete and to fully convey the technical ideas of the disclosure to those skilled in the art. Throughout the specification, like reference numerals refer to like elements. Furthermore, various elements and areas in the drawings are drawn schematically. Accordingly, the technical ideas of the present disclosure are not limited by the relative sizes or spacing shown in the accompanying drawings.

Conventional bonding wires are formed using only metals such as gold, silver, copper or aluminum, or are formed by coating a silver core with gold, coating a gold core with aluminum, coating a gold core with copper, coating copper with palladium, or coating copper with aluminum, depending on the purpose. However, as chips are miniaturized, the diameter of the bonding wires is reduced and the spacing between the bonding wires is reduced. Accordingly, when the bonding wires are used, they come into contact with each other and a shorting phenomenon occurs. Therefore, there is an increasing interest in forming an insulation layer on the surface of the bonding wires.

According to a technical idea of the present disclosure, a bonding wire coated with oxide insulation and a semiconductor package including the same are provided.

Figure 1:
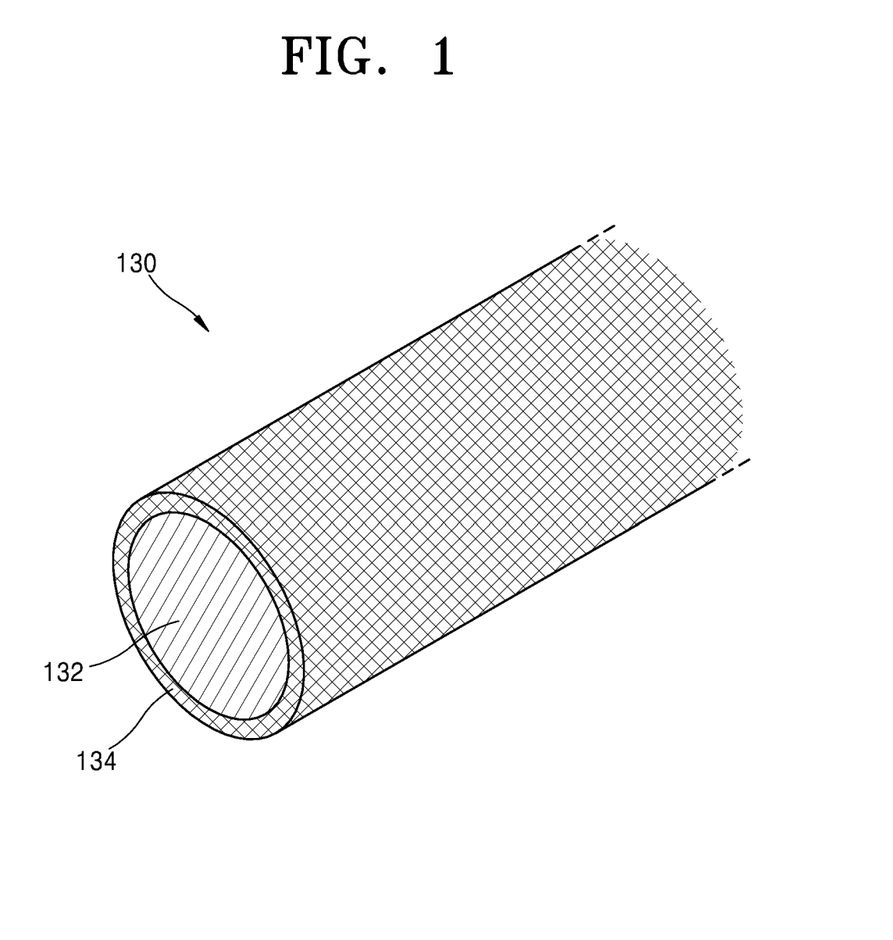
FIG. 1 is a schematic view illustrating a bonding wire according to one embodiment of the present disclosure.

FIG. 1 is a schematic view illustrating a bonding wire 130 according to one embodiment of the present disclosure.

Referring to FIG. 1, the bonding wire 130 includes a metal core 132 disposed therein and an oxide insulation coating 134 covering the metal core 132.

The metal core 132 may have a diameter in the range of 0.1 mm to 5.0 mm, for example, and may have a diameter in the range of 0.1 mm to 1.0 mm, for example. The metal core 132 may contain a metal, for example, gold (Au), silver (Ag), copper (Cu), aluminum (Al), tin (Sn), palladium (Pd), and an alloy thereof. The metal core 132 may have a variety of cross-sectional shapes, such as a circular, oval, semicircular, triangular, or rectangular shape.

The oxide insulation coating 134 may serve to insulate the metal core 132 from the outside, and may also serve a passivation function to protect the metal core 132. The oxide insulation coating 134 may completely cover the metal core 132. The oxide insulation coating 134 may have a thickness in the range of 2 nm to 100 nm, for example, and may have a thickness in the range of 2 nm to 50 nm, for example. The thickness of the oxide insulation coating 134 may increase as the applied voltage increases.

The oxide insulation coating 134 may include an insulative material and may include an oxide, for example, at least one of aluminum oxide ($Al_2O_3$), titanium oxide ($TiO_2$), zirconium oxide ($ZrO_2$), and hafnium oxide ($HfO_2$). In particular, when the oxide insulation coating 134 is formed of at least one of aluminum oxide, titanium oxide, zirconium oxide, and hafnium oxide, the bonding wire has an excellent insulation property and an excellent dielectric strength, and is highly stable because it does not form an intermetallic compound with the material constituting the metal core 132. It provides an excellent bonding property of the bonding wire and an excellent protectiveness. The oxide insulation coating 134 may be formed using physical vapor deposition (PVD), chemical vapor deposition (CVD), or atomic layer deposition (ALD).

Figure 2:
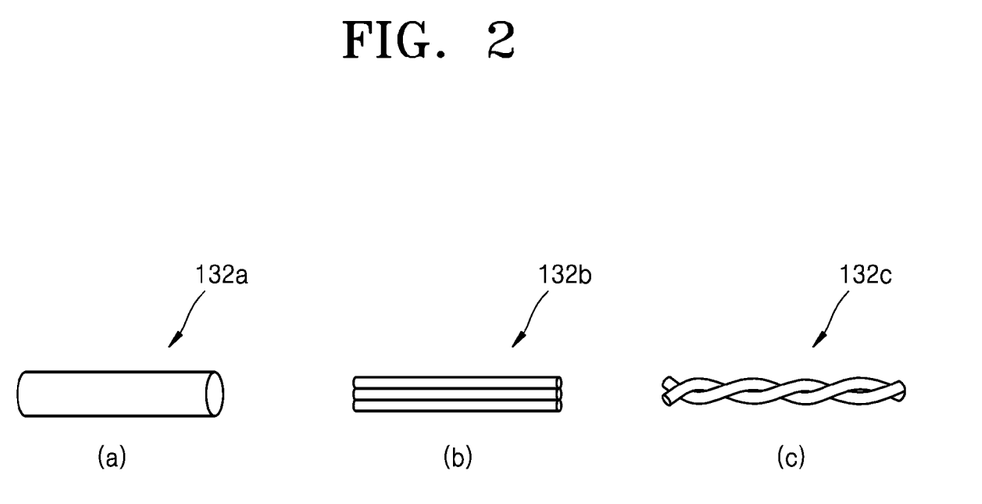
FIG. 2 is a schematic view illustrating a metal core of a bonding wire according to one embodiment of the present disclosure.

FIG. 2 is a schematic view illustrating the metal core 132 of the bonding wire 130 according to one embodiment of the present disclosure.

Referring to FIG. 2, the metal core 132 may include a metal core 132a composed of a single wire, a metal core 132b including multiple coaxial wires, or a metal core 132c composed of a plurality of wires twisted together.

Figure 3:
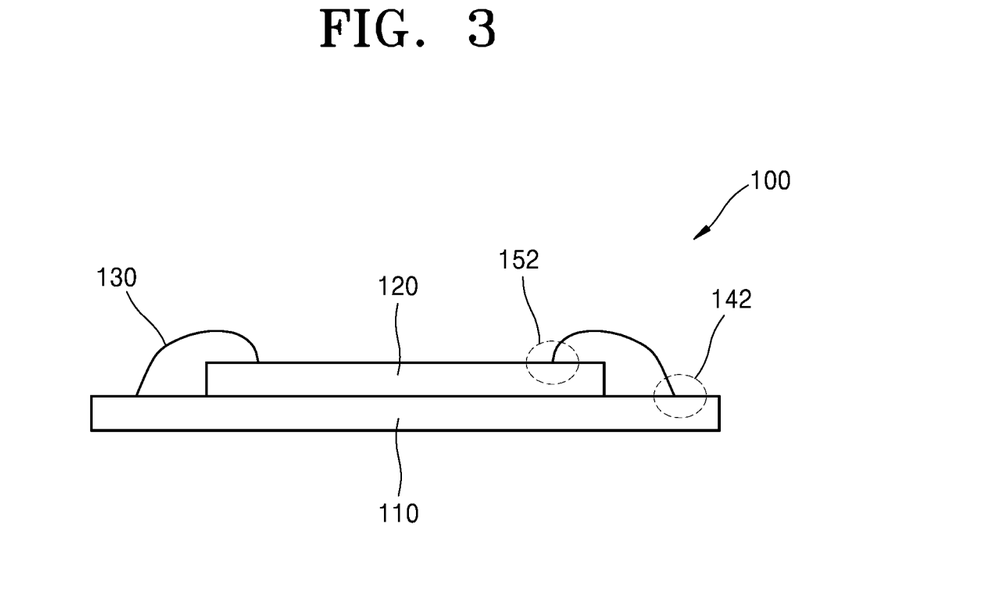
FIG. 3 is a cross-sectional view illustrating a semiconductor package according to one embodiment of the present disclosure.

FIG. 3 is a cross-sectional view illustrating a semiconductor package 100 according to one embodiment of the present disclosure.

Figure 4:
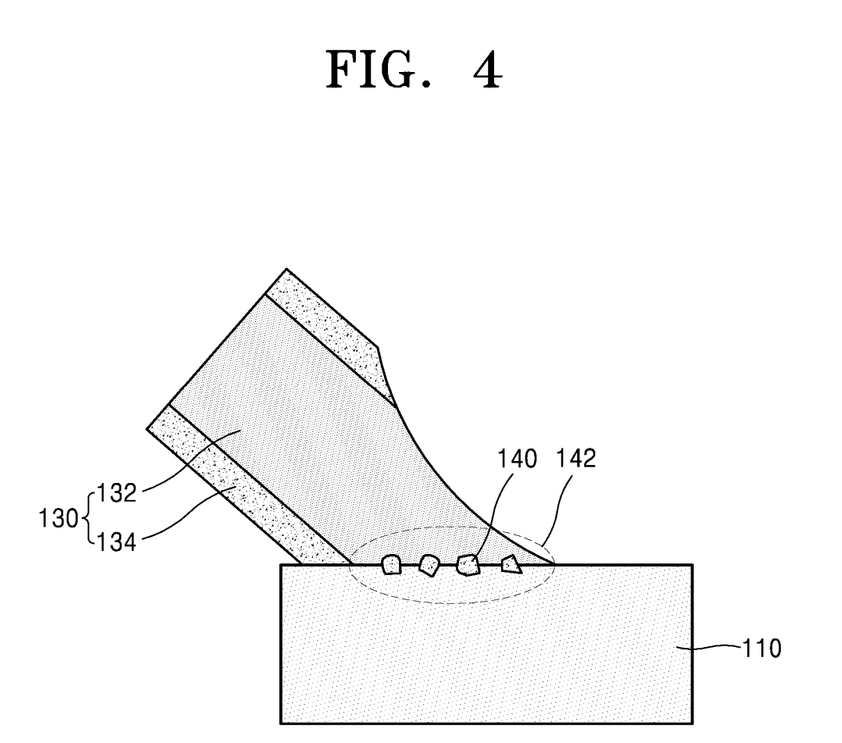
FIGS. 4 to 6 are cross-sectional views illustrating connection states of a bonding wire in the semiconductor package according to one embodiment of the present disclosure.
Figure 5:
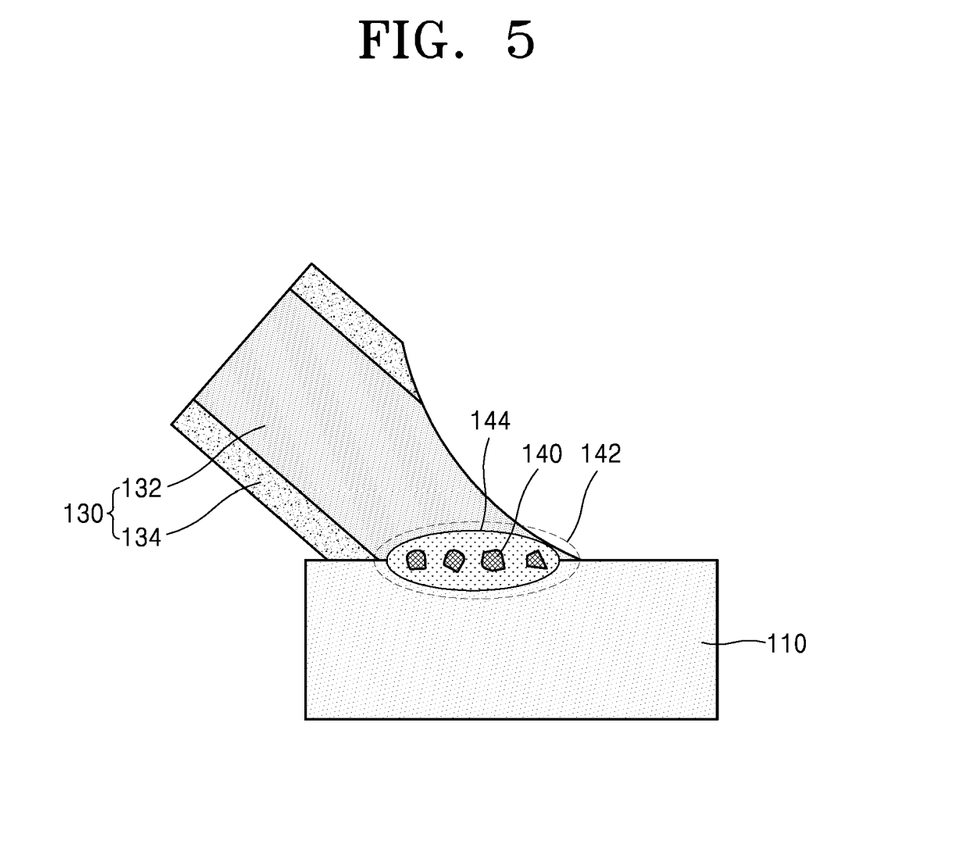
Figure 6:
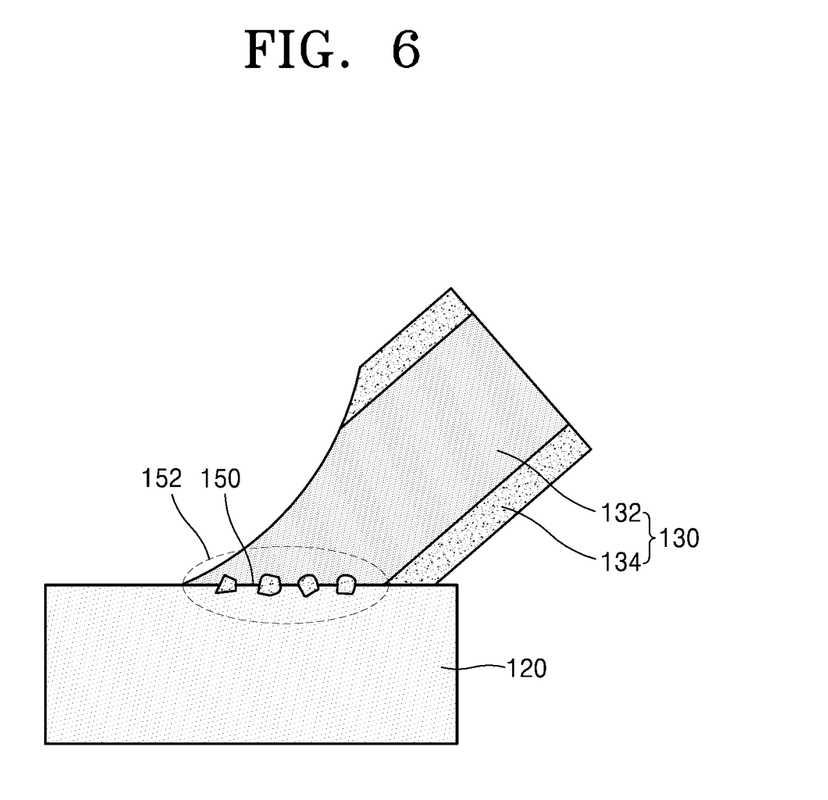

FIGS. 4 to 6 are cross-sectional views illustrating connection states of a bonding wire in the semiconductor package 100 according to one embodiment of the present disclosure.

Referring to FIGS. 3 to 6, the semiconductor package 100 includes a substrate 110, a semiconductor chip 120, bonding wires 130, and first fragments 140.

The semiconductor package 100 may include various semiconductor packages employing bonding wires, such as a system-in-package (SIP), small outline package (SOP), quad flat package (QFP), small outline J-band package (SOJ), plastic leaded chip carrier (PLCC), J leaded chip carrier (JLCC), mini square package (MSP), leadless chip carrier (LCC), dual in-line package (DIP), single in-line package (SILP), zigzag in-line package (ZIP), shrink dual in-line package (S-DIP), skinny dual in-line package (SK-DIP), pin grid array (PGA), ceramic ball grid array (CBGA), ceramic pin grid array (CPGA), tape carrier package (TCP), leadless chip package (LCC), chip on board (COB), chip on glass (COG), or chip scale package (CSP).

The substrate 110 may include various substrates, and may include, for example, a printed circuit board, a lead frame, a flexible printed circuit board, an LED metal-core printed circuit board (MCPCB), or battery module electrodes.

The semiconductor chip 120 may be mounted on the substrate 110. The semiconductor chip 120 may be mounted on the substrate 110 in various ways. The semiconductor chip 120 may include various semiconductor chips. The semiconductor chip 120 may be, for example, a memory semiconductor chip. For example, the memory semiconductor chip may be a volatile memory semiconductor chip, such as a dynamic random access memory (DRAM) or static random access memory (SRAM), or a non-volatile memory semiconductor chip, such as a phase-change random access memory (PRAM), magnetoresistive random access memory (MRAM), ferroelectric random access memory (FeRAM), or resistive random access memory (RRAM). The semiconductor chip 120 may also be a logic semiconductor chip, such as, for example, a central processing unit (CPU, MPU), an application processor (AP), a graphics processing semiconductor chip (GPU), or an image sensor semiconductor chip.

The bonding wires 130 may electrically connect the substrate 110 and the semiconductor chip 120. The bonding wire 130 may include a metal core 132 disposed therein and an oxide insulation coating 134 covering the metal core 132.

Referring to FIG. 4, the substrate 110 and the bonding wire 130 are connected at a first portion 142. Located in the first portion 142 are first fragments 140, which may be formed of the same material as the oxide insulation coating 134 of the bonding wire 130. The first fragments 140 may include fragments of the oxide insulation coating 134 that are fragmented during the process of bonding the bonding wire 130.

Referring to FIG. 5, the substrate 110 and the bonding wire 130 are connected at the first portion 142. Additionally, an intermetallic compound layer 144 formed within the first portion 142 where the substrate 110 and the bonding wire 130 are connected may be included. Additionally, at least a portion of the first fragments 140 may be located within the intermetallic compound layer 144. Alternatively, at least a portion of the first fragments 140 may be located at an interface of the bonding wire 130 and the intermetallic compound layer 144, or at an interface of the substrate 110 and the intermetallic compound layer 144. The intermetallic compound layer 144 may be formed by alloyization of a material constituting a pad of the substrate 110 and a material constituting the bonding wire 130 in contact with the pad.

Referring to FIG. 6, the semiconductor chip 120 and the bonding wire 130 are connected at a second portion 152. Located in the second portion 152 are second fragments 150, which may be formed of the same material as the oxide insulation coating 134 of the bonding wire 130. The second fragments 150 may include fragments of the oxide insulation coating 134 that are fragmented during the process of bonding the bonding wire 130. Also, although not shown, an intermetallic compound layer, such as the intermetallic compound layer 144 described above, may be formed in the second portion 152, and at least a portion of the second fragments 150 may be located within the intermetallic compound layer.

As the first fragments 140 or second fragments 150 are composed of metal oxides, such as at least one of aluminum oxide, titanium oxide, zirconium oxide, and hafnium oxide, the roughness of the surface of the substrate 110 or semiconductor chip 120 may be increased, thereby improving adhesion to the bonding wire 130. In addition, since the bonding between the metal oxide, such as at least one of aluminum oxide, titanium oxide, zirconium oxide, and hafnium oxide, and the metal, is stronger than the bonding by an intermetallic oxide, the adhesion may be enhanced.

Figure 7:
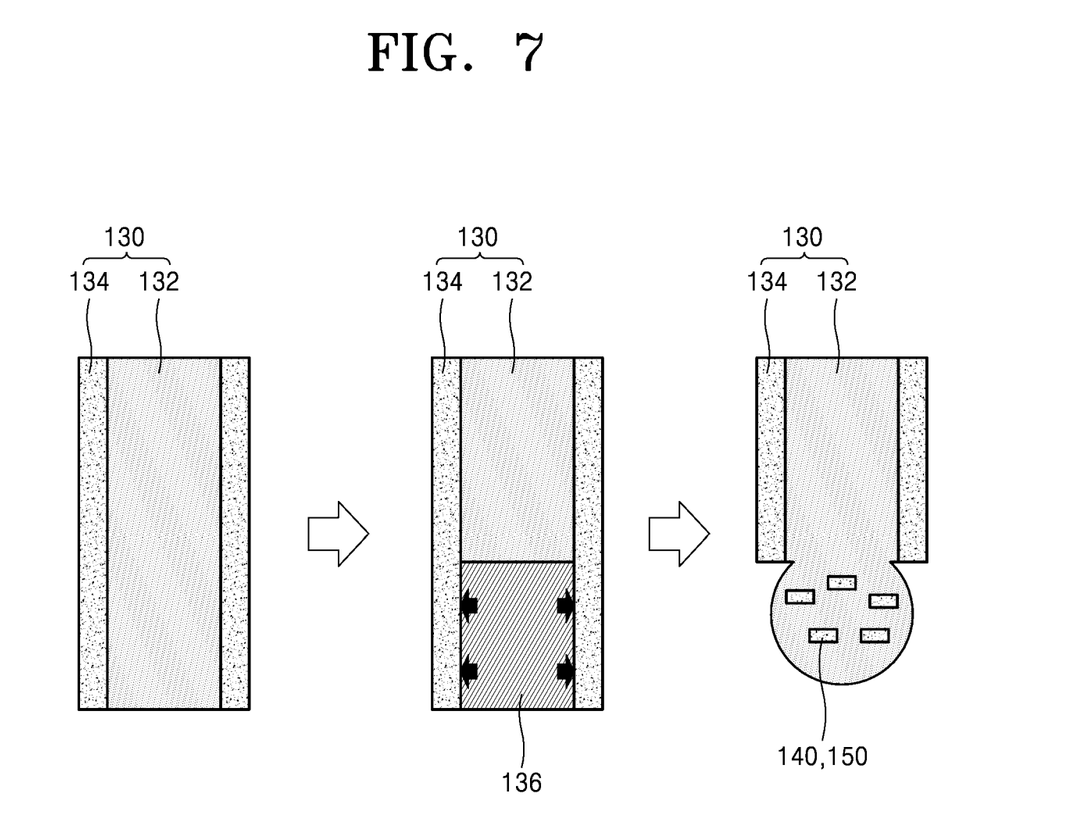
FIG. 7 is a schematic view illustrating a bonding process of a bonding wire in a semiconductor package according to one embodiment of the present disclosure.

FIG. 7 is a schematic view illustrating a bonding process of a bonding wire in a semiconductor package according to one embodiment of the present disclosure.

Referring to FIG. 7, first, a bonding wire 130 composed of a metal core 132 and an oxide insulation coating 134 is provided. Then, by heating one end of the bonding wire 130, the metal core 132 is heated to form a liquid metal 136, whereby the oxide insulation coating 134 is subjected to pressure in an outward direction. This heating may be accomplished by means of an electrical spark or a laser. Accordingly, the insulation coating 134 is fragmented by the pressure. Subsequently, the fragments 140, 150 of the fragmented insulation coating 134 are mixed with the liquid metal 136. Accordingly, the fragments 140, 150 remain in the first portion 142 of the substrate 110 or the second portion 152 of the semiconductor chip 120.

The bonding wire may be applied in the case of connecting one semiconductor chip to another, as will be described below.

Figure 8:
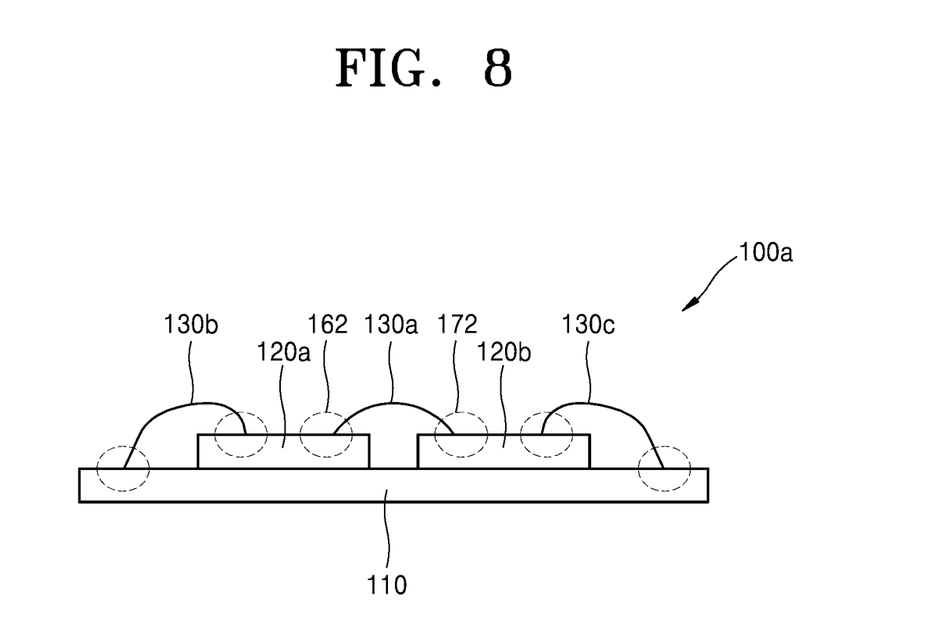
FIG. 8 is a cross-sectional view illustrating a semiconductor package according to one embodiment of the present disclosure.

FIG. 8 is a cross-sectional view illustrating a semiconductor package 100a according to one embodiment of the present disclosure.

Figure 9:
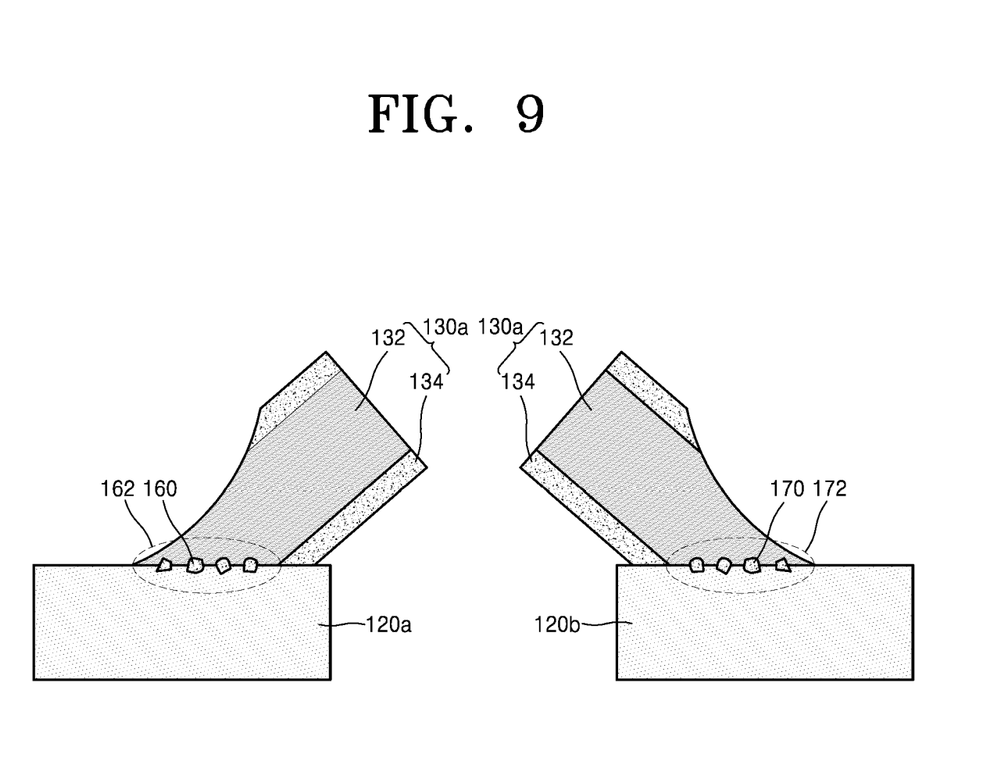
FIG. 9 is a cross-sectional view illustrating connection states of a bonding wire in the semiconductor package according to one embodiment of the present disclosure.

FIG. 9 is a cross-sectional view illustrating connection states of a bonding wire in the semiconductor package 100a according to one embodiment of the present disclosure.

In FIG. 8, the regions indicated by the dotted lines represent regions in which the semiconductor chips and the bonding wires are connected or regions in which the substrate and the bonding wires are connected.

Referring to FIGS. 8 and 9, the semiconductor package 100a includes a substrate 110; first and second semiconductor chips 120a and 120b mounted on the substrate 110; a first bonding wire 130a electrically connecting the first semiconductor chip 120a and the second semiconductor chip 120b and including a metal core disposed therein, an oxide insulation coating covering the metal core; and third fragments 160 located in a third portion 162 where the first semiconductor chip 120a and the first bonding wire 130a are connected, and formed of the same material as the oxide insulation coating of the first bonding wire 130a.

It may also include fourth fragments 170 located in a fourth portion 172 where the second semiconductor chip 120*b* and the first bonding wire 130*a* are connected, and formed of the same material as the oxide insulation coating of the first bonding wire 130*a*.

It may further include second bonding wire 130*b* and 130*c* electrically connecting one of the first semiconductor chip 120*a* and the second semiconductor chip 120*b* to the substrate 110; and fifth fragments located in a portion where the substrate 110 and the second bonding wires 130*b* and 130*c* are connected, and formed of the same material as the oxide insulation coating of the second bonding wire 130*b* and 130*c*. The fifth fragments may be the same as the first fragments 140 or the second fragments 150 described above.

In addition, although not shown, a metal intermetallic layer such as the metal intermetallic layer 144 described above may be formed in the third portion 162 and the fourth portion 172, and at least a portion of the third fragments 160 and at least a portion of the fourth fragments 170 may each be located within the intermetallic compound layer.

Although the substrate 110 is shown as a single substrate, this is exemplary. A case where the substrate 110 consists of two separate substrates, and the first semiconductor chip 120*a* and the second semiconductor chip 120*b* are located on each of the separate substrates is also within the technical ideas of the present disclosure.

As described above, by electrically connecting the substrate to the semiconductor chip or one semiconductor chip to another using a bonding wire coated with oxide insulation, the semiconductor package according to the technical ideas of the present disclosure may prevent shorts between the bonding wires, may allow the bonding wires to be integrated at a high density, and may also allow the use of a long bonding wire between chips.

Figure 10:
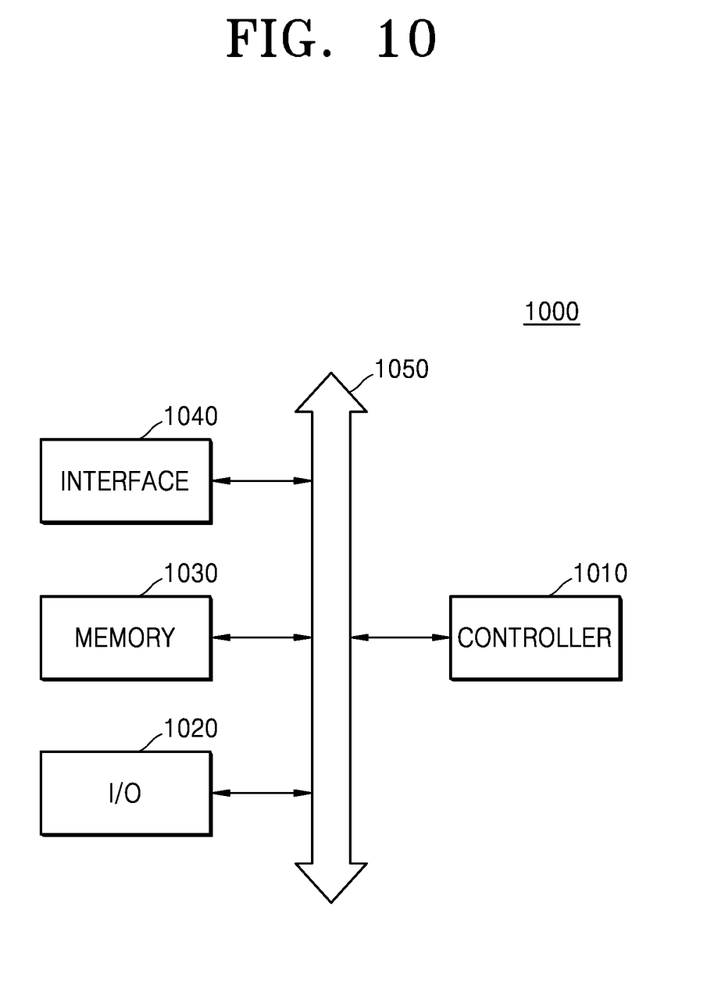
FIG. 10 is a block diagram of an electronic system according to one embodiment of the present disclosure.

FIG. 10 is a block diagram of an electronic system according to one embodiment of the present disclosure.

Referring to FIG. 10, an electronic system 1000 includes a controller 1010, an input/output device (I/O) 1020, a memory 1030, and an interface 1040, each interconnected via a bus 1050.

The controller 1010 may include at least one of a microprocessor, a digital signal processor, or a similar processing device. The I/O device 1020 may include at least one of a keypad, a keyboard, or a display. The memory 1030 may be used to store instructions executed by the controller 1010. For example, the memory 1030 may be used to store user data. The electronic system 1000 includes at least one of the semiconductor packages described above, and semiconductor packages manufactured by various manufacturing methods that are modified and altered therefrom within the scope of the technical ideas of the present disclosure.

Figure 11:
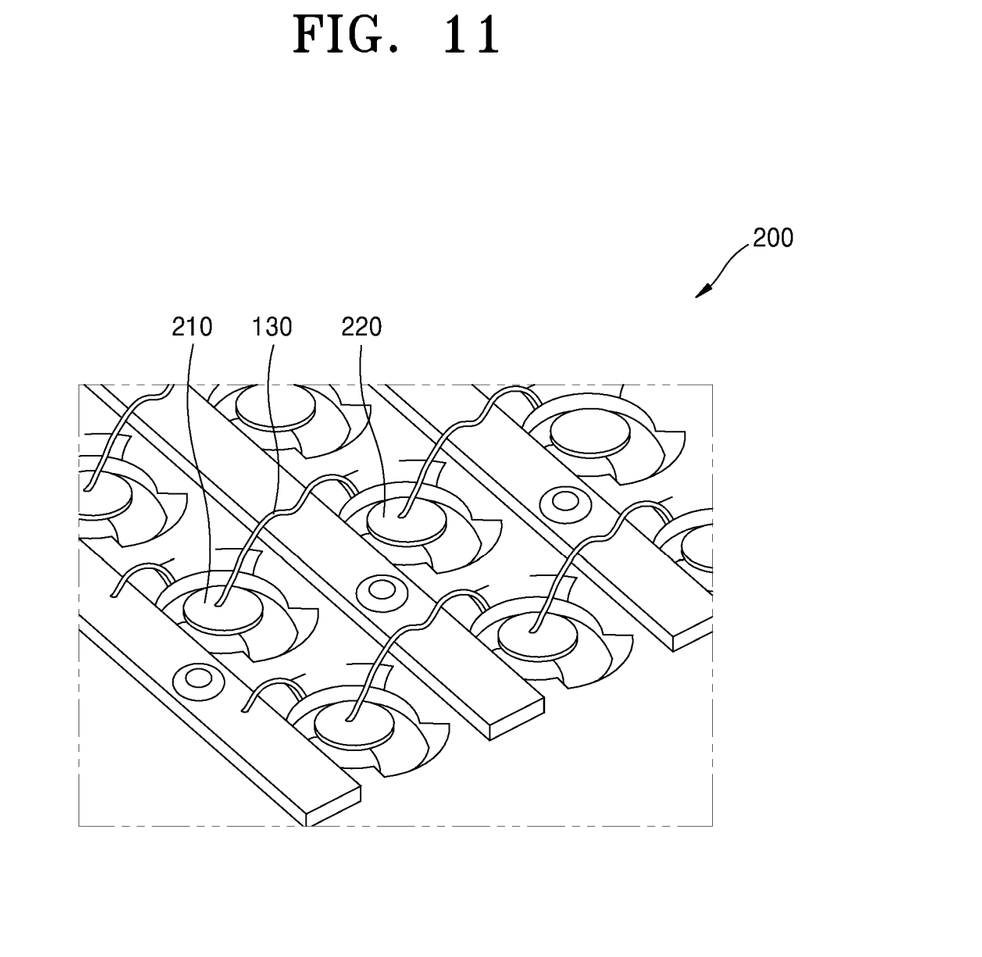
FIG. 11 is a schematic view illustrating a battery module according to one embodiment of the present disclosure.

FIG. 11 is a schematic view illustrating a battery module 200 according to one embodiment of the present disclosure.

Referring to FIG. 11, the battery module 200 includes a first battery 210; a second battery 220 electrically connected to the first battery 210; a bonding wire 130 electrically connecting the first battery 210 and the second battery 220 and including a metal core disposed therein, and an oxide insulation coating covering the metal core; and fragments located at a portion where the first battery 210 or the second battery 220 and the bonding wire 130 are connected, and formed of the same material as the oxide insulation coating of the bonding wire 130.

The metal core may be substantially the same as the metal core 132 described above. The oxide insulation coating may be substantially the same as the oxide insulation coating 134 described above. The fragments may be substantially the same as the first fragments 140 described above.

Also, the bonding wire according to the technical idea of the present disclosure may be applied to the wire inside the motor of an electric vehicle, and may be applied to various wiring.

It will be apparent to one of ordinary skill in the art to which the present disclosure pertains that the technical ideas described above are not limited to the above-described embodiments and accompanying drawings, and that various substitutions, modifications, and changes are possible without departing from the technical ideas of the present disclosure.

The invention claimed is:

1. A semiconductor package comprising:
a substrate;
a semiconductor chip mounted on the substrate;
a bonding wire electrically connecting the substrate and the semiconductor chip, the bonding wire comprising:
a metal core disposed therein; and
an oxide insulation coating covering the metal core; and
first fragments located in a first portion where the substrate and the bonding wire are connected, the first fragments being formed of the same material as the oxide insulation coating of the bonding wire,
wherein the first fragments comprise fragments of the oxide insulation coating fragmented by pressure from a liquid metal from the metal core heated by heating the bonding wire while the bonding wire is bonded,
wherein the bonding wire is connected to the substrate in the first portion while a bonding portion including the liquid metal and the first fragments is formed by heating an end of the bonding wire with the oxide insulation coating covering the metal core to the end in a longitudinal direction of the metal core.

2. The semiconductor package of claim 1, wherein the oxide insulation coating contains a metal oxide corresponding to at least one of aluminum oxide, titanium oxide, zirconium oxide, or hafnium oxide, the metal oxide being formed on the metal core using atomic layer deposition (ALD).

3. The semiconductor package of claim 2, further comprising:
an intermetallic compound layer formed within the first portion where the substrate and the bonding wire are connected,
wherein at least a portion of the first fragments is located within the intermetallic compound layer.

4. The semiconductor package of claim 1, further comprising:
second fragments located in a second portion where the semiconductor chip and the bonding wire are connected, the second fragments being formed of the same material as the oxide insulation coating of the bonding wire.

5. The semiconductor package of claim 3, wherein the second fragments comprise fragments of the oxide insulation coating fragmented while the bonding wire is bonded.

6. The semiconductor package of claim 1, wherein the metal core contains gold, silver, copper, aluminum, palladium, and alloys thereof.

7. The semiconductor package of claim 1, wherein the oxide insulation coating has a thickness of 10 nm to 20 nm.

8. The semiconductor package of claim 1, wherein the metal core consists of a single wire, comprises a plurality of coaxial wires, or comprises a plurality of wires twisted together.

9. A semiconductor package comprising:
a substrate;
first and second semiconductor chips mounted on the substrate;
a first bonding wire electrically connecting the first semiconductor chip and the second semiconductor chip, the first bonding wire comprising:
a metal core disposed therein; and
an oxide insulation coating covering the metal core; and
third fragments located in a portion where the first semiconductor chip and the first bonding wire are connected, the third fragments being formed of the same material as the oxide insulation coating of the bonding wire,
wherein the third fragments comprise fragments of the oxide insulation coating fragmented by pressure from a liquid metal from the metal core heated by heating the first bonding wire while the first bonding wire is bonded,
wherein the first bonding wire is connected to the first semiconductor chip while a bonding portion including the liquid metal and the third fragments is formed by heating an end of the first bonding wire with the oxide insulation coating covering the metal core to the end in a longitudinal direction of the metal core.

10. The semiconductor package of claim 9, wherein the oxide insulation coating contains a metal oxide corresponding to at least one of aluminum oxide, titanium oxide, zirconium oxide, or hafnium oxide, the metal oxide being formed on the metal core using atomic layer deposition (ALD).

11. The semiconductor package of claim 10, further comprising:
an intermetallic compound layer formed within the portion where the first semiconductor chip and the bonding wire are connected,
wherein at least a portion of the third fragment is located within the intermetallic compound layer.

12. The semiconductor package of claim 9, further comprising:
fourth fragments located in a portion where the second semiconductor chip and the first bonding wire are connected, the fourth fragments being formed of the same material as the oxide insulation coating of the first bonding wire;
a second bonding wire electrically connecting one of the first semiconductor chip and the second semiconductor chip to the substrate; and
fifth fragments located in a portion where the substrate and the second bonding wire are connected, the fifth fragments being formed of the same material as the oxide insulation coating of the second bonding wire.

* * * * *